(12) United States Patent
Song et al.

(10) Patent No.: US 9,391,127 B2
(45) Date of Patent: *Jul. 12, 2016

(54) DISPLAY DEVICE FOR CONTROLLING LIGHT TRANSMITTANCE

(71) Applicant: Samsung Display Co., Ltd., Yongin, Gyeonggi-Do (KR)

(72) Inventors: Young-Woo Song, Yongin (KR); Sang-Hoon Yim, Yongin (KR); Jin-Koo Chung, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 16 days.

This patent is subject to a terminal disclaimer.

(21) Appl. No.: 14/266,414

(22) Filed: Apr. 30, 2014

(65) Prior Publication Data

US 2015/0168776 A1    Jun. 18, 2015

(30) Foreign Application Priority Data

Dec. 18, 2013    (KR) .................... 10-2013-0158680

(51) Int. Cl.
*G02F 1/1335*    (2006.01)
*H05B 33/14*    (2006.01)
*H01L 27/32*    (2006.01)
*H01L 51/52*    (2006.01)
*G02F 1/13363*    (2006.01)

(52) U.S. Cl.
CPC ........ *H01L 27/3232* (2013.01); *H01L 51/5281* (2013.01); *G02F 1/13363* (2013.01); *G02F 2001/133638* (2013.01); *G02F 2413/02* (2013.01); *G02F 2413/05* (2013.01)

(58) Field of Classification Search
None
See application file for complete search history.

(56) References Cited

U.S. PATENT DOCUMENTS

| | | | |
|---|---|---|---|
| 2003/0193457 A1 | 10/2003 | Wang et al. | |
| 2004/0051445 A1* | 3/2004 | Adachi | 313/504 |
| 2005/0264190 A1* | 12/2005 | Park et al. | 313/506 |
| 2007/0109465 A1 | 5/2007 | Jung et al. | |
| 2011/0249211 A1 | 10/2011 | Song et al. | |
| 2012/0099054 A1* | 4/2012 | Takeuchi et al. | 349/98 |
| 2012/0268696 A1 | 10/2012 | Yim et al. | |
| 2012/0327331 A1 | 12/2012 | Yim et al. | |
| 2013/0314647 A1 | 11/2013 | Yim et al. | |

FOREIGN PATENT DOCUMENTS

| | | |
|---|---|---|
| JP | 2003-316295 A | 11/2003 |
| KR | 10-2005-0043174 A | 5/2005 |
| KR | 10-2006--0034039 A | 4/2006 |
| KR | 10-2006-0097927 A | 9/2006 |
| KR | 10-2007-0046353 A | 5/2007 |
| KR | 10-2007-0051500 A | 5/2007 |
| KR | 10-2009-0100920 A | 9/2009 |
| KR | 10-2012-0052914 A | 5/2012 |
| KR | 10-2013-0132108 A | 12/2013 |

* cited by examiner

*Primary Examiner* — Ashok Patel
(74) *Attorney, Agent, or Firm* — Knobbe Martens Olson & Bear LLP

(57) ABSTRACT

A display device that can control light transmittance is disclosed. One aspect is a display device for controlling light transmittance. The display device includes a light-emitting region and a light-transmitting region. The light-emitting region includes a light-emitting unit. The light-transmitting region includes a light-transmitting unit configured to adjust the transmittance of external light, wherein the light-emitting unit and the light-transmitting unit are formed over the same substrate.

16 Claims, 14 Drawing Sheets

DISPLAY DEVICE FOR CONTROLLING LIGHT TRANSMITTANCE

RELATED APPLICATION

This application claims the benefit of Korean Patent Application No. 10-2013-0158680, filed on Dec. 18, 2013, in the Korean Intellectual Property Office, the disclosure of which is incorporated herein in its entirety by reference.

BACKGROUND

1. Field

The described technology generally relates to a display device for controlling light transmittance.

2. Description of the Related Technology

Due to their excellent viewing angle, contrast, response time, power consumption, and other characteristics, organic light-emitting diode (OLED) displays are widely used in personal portable devices including MP3 players, mobile phones, TVs, etc. Because the OLED displays are self-emissive, they do not require a separate light source as opposed to liquid crystal displays (LCDs). Therefore, the thickness and weight of OLED displays can be less compared to LCDs. In addition, OLED displays can have a transmission region (or a transmission window) that is formed separately from a region in which a transparent thin film transistor (TFT) or a transparent OLED is formed. Accordingly, OLED displays can be manufactured to be transparent, thereby allowing transmission of external light to a viewer.

SUMMARY OF CERTAIN INVENTIVE ASPECTS

One inventive aspect includes a display device for controlling external light transmittance.

Another aspect is a display device for controlling light transmittance that includes a transparent display device including a plurality of pixels each including a first region that includes an organic light-emitting diode (OLED) and thus emits light, and a second region transmitting external light, the OLED includes a first electrode that is independently formed in the first region of each of the plurality of pixels, an organic layer formed on the first electrode and that includes an organic emission layer, and a second electrode that covers the organic layer and is formed throughout and connected to the plurality of pixels; a first polarizer, formed on an optical path of light emitted from the transparent display device, circularly polarizing and transmitting external light; and a second polarizer, formed on an opposite direction of the optical path of light emitted from the transparent display device, circularly polarizing and transmitting external light, in which the second region includes a liquid crystal device that adjusts external light transmittance by using a combination of the first and second linear polarizers.

The liquid crystal device can include a third electrode independently formed in the second region of each of the plurality of pixels; a liquid crystal layer formed on the third electrode and that is encapsulated from the outside; and a fourth electrode that covers the liquid crystal layer and is formed throughout and connected to the plurality of pixels.

A plurality of thin film transistors (TFTs) formed in the first region of each of the plurality of pixels; and at least one insulating layer covering the plurality of TFTs can be further included. A transmission window can be formed at a portion of the at least one insulating layer which corresponds to the second region, and the liquid crystal layer can be formed in the transmission window.

The first electrode can be a light-reflecting electrode, and the third electrode can be a light-transmitting electrode.

The first region can include a circuit area including a thin film transistor (TFT), and an emission area including the first electrode, and the circuit area and the emission area can overlap each other.

The fourth and second electrodes can be integrally formed.

The first and third electrodes can be light-transmitting electrodes.

The first region can include a circuit area including a thin film transistor (TFT), and an emission area including the first electrode. The circuit area and the emission area can be adjacent to each other.

The fourth and second electrodes can be separately formed.

The liquid crystal device can be independently formed for each of the plurality of pixels.

The liquid crystal device can be connected to at least two pixels that are adjacent to each other.

Vertical alignment nematic (VAN) liquid crystals can be formed in the liquid crystal layer.

The transparent display device can include a substrate on which the plurality of pixels are formed at a first surface; and an encapsulating substrate facing the first surface.

The encapsulating substrate can be a thin film encapsulation (TFE) member.

The first polarizer can include a first linear polarizer, formed at an outer side of the encapsulating substrate, linearly polarizing and transmitting external light; and a first retarder, formed between the first linear polarizer and the encapsulating substrate, retarding a phase of external light by a first phase and transmitting external light. The second polarizer can include a second linear polarizer, formed at an outer side of the substrate, linearly polarizing and transmitting external light; and a second retarder, formed between the second linear polarizer and the substrate, retarding the phase of external light by a second phase and transmitting external light. The first and second phases can have the same absolute values but different rotation directions.

Another aspect is a display device for controlling light transmittance. The display device includes a transparent display, a first polarizer and a second polarizer. The transparent display includes a plurality of pixels each comprising a first region that includes an organic light-emitting diode (OLED), and a second region configured to transmit external light. The OLED includes i) a first electrode formed in the first region of each pixel, ii) an organic layer including an organic emission layer, wherein the organic layer is formed over the first electrode, and iii) a second electrode substantially covering the organic layer and is electrically connected to the pixels. The first polarizer is formed over one side of an optical path of light emitted from the transparent display, wherein the first polarizer is configured to polarize and transmit external light. The second polarizer is formed over the opposite side of the optical path of the emitted light, wherein the second polarizer is configured to polarize the output of the first polarizer. The second region includes a liquid crystal device formed between the first and second polarizers. The combination of the first polarizer, the liquid crystal device and the second polarizer is configured to adjust the transmittance of external light through the transparent display.

In the above display device, the liquid crystal device includes a third electrode formed in the second region of each pixel, a liquid crystal layer formed over the third electrode, wherein the liquid crystal layer is not exposed to the environment, and a fourth electrode substantially covering the liquid crystal layer and electrically connected to the pixels. The above display device further includes a plurality of thin film transistors (TFTs) formed in the first region of each pixel, at least one insulating layer substantially covering the TFTs, and a transmission window formed in a portion of the at least one insulating layer corresponding to the second region, wherein the liquid crystal layer is formed in the transmission window.

In the above display device, the first electrode is a light-reflecting electrode, and wherein the third electrode is a light-transmitting electrode. In the above display device, the first region comprises a circuit area including a thin film transistor (TFT), and an emission area including the first electrode, and wherein the circuit area and the emission area substantially overlap each other. In the above display device, the fourth and second electrodes are integrally formed. In the above display device, the first and third electrodes are light-transmitting electrodes.

In the above display device, the first region comprises a circuit area including a thin film transistor (TFT), and an emission area including the first electrode. In the above display device, the circuit area and the emission area are adjacent to each other. In the above display device, the fourth and second electrodes are formed separately. In the above display device, the liquid crystal device is formed separately for each pixel. In the above display device, the liquid crystal device is electrically connected to at least two adjacent pixels. In the above display device, vertical alignment nematic (VAN) liquid crystals are formed in the liquid crystal layer. In the above display device, the transparent display device includes a substrate on which the pixels are formed over a first surface thereof, and an encapsulating substrate facing the first surface. In the above display device, the encapsulating substrate is a thin film encapsulation (TFE) member.

In the above display device, the first polarizer includes a first linear polarizer and a first retarder. In the above display device, the first linear polarizer is formed over the encapsulating substrate, wherein the first polarizer is configured to linearly polarize the external light and output a first linearly polarized light. In the above display device, the first retarder is formed between the first linear polarizer and the encapsulating substrate, wherein the first retarder is configured to change a phase of the first linearly polarized light by a first phase and output a first retarded light. In the above display device, the second polarizer includes a second linear polarizer and a second retarder. In the above display device, the second linear polarizer is formed below the substrate, wherein the second linear polarizer is configured to linearly polarize the first retarded light and output a second linearly polarized light. In the above display device, the second retarder is formed between the second linear polarizer and the substrate wherein the second retarder is configured to change the phase of the second linearly polarized light by a second phase. In the above display device, the first and second phases have substantially the same absolute value but different rotation directions.

Another aspect is a display device for controlling light transmittance. The display device includes a light-emitting region including a light-emitting unit, and a light-transmitting region comprising a light-transmitting unit configured to adjust the transmittance of external light. The light-emitting unit and the light-transmitting unit are formed over the same substrate.

In the above display device, the light-emitting unit is an organic light-emitting diode (OLED), and wherein the light-transmitting unit is a liquid crystal device. The above display device further includes a first polarizer configured to polarize and transmit external light, and a second configured to polarize the output of the first polarizer. In the above display device, the liquid crystal device is interposed between the first and second polarizers.

In the above display device, the first polarizer includes a first linear polarizer configured to linearly polarize the external light and output a first linearly polarizing light, and a first retarder configured to change a phase of the first linearly polarized light by a first phase and output a first retarded light. In the above display device, the second polarizer includes a second linear polarizer configured to linearly polarize the first retarded light and output a second linearly polarized light, and a second retarder configured to change the phase of the second linearly polarized light by a second phase.

DETAILED DESCRIPTION OF CERTAIN INVENTIVE EMBODIMENTS

Figure 1:
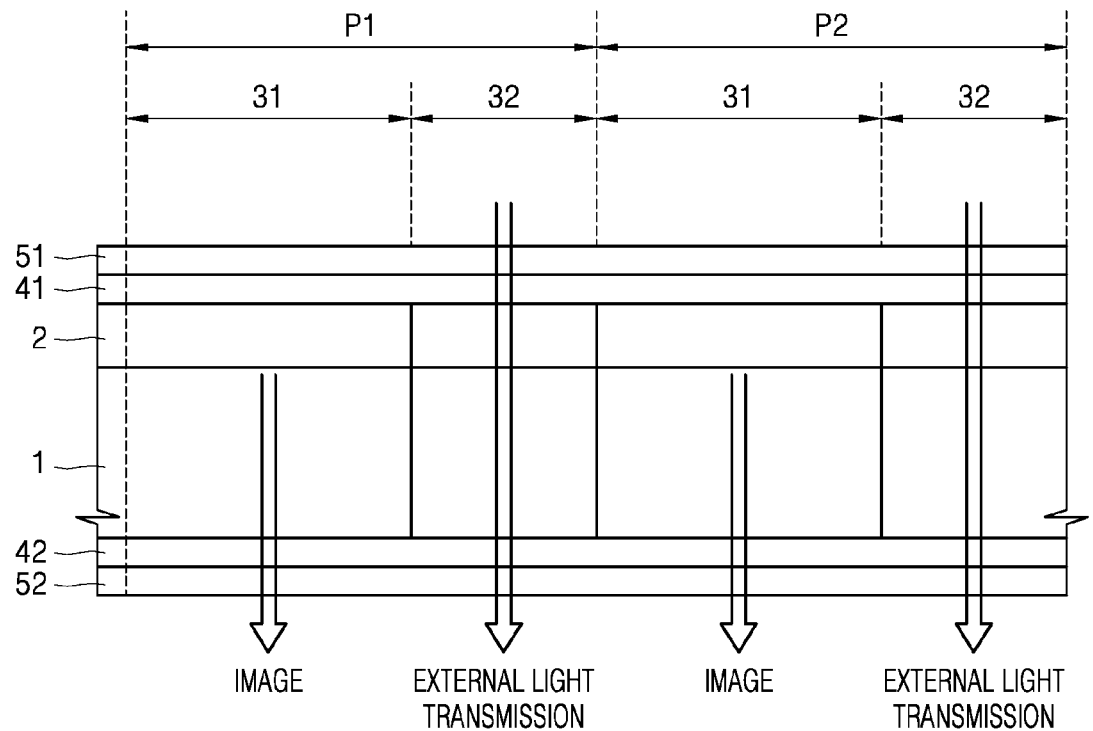
FIG. 1 is a schematic cross-sectional view of a display device according to an embodiment.

Reference will now be made in detail to embodiments, examples of which are illustrated in the accompanying drawings, wherein like reference numerals refer to like elements throughout. In this regard, the present embodiments can have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In this disclosure, the term "substantially" means completely, almost completely or to any significant degree. Furthermore, the term "about" modifies a numerical value to include at least a range that is less or greater than the numerical value by 0 to 1%, 0 to 5% or 0 to 10%. Moreover, "formed on" can also mean "formed over".

FIG. 1 is a schematic cross-sectional view of a display device according to an embodiment.

Referring to FIG. 1, the display device includes a first linear polarizer 51, a first retarder 41, a transparent display device, a second retarder 42, and a second linear polarizer 52.

The transparent display device includes a substrate 1 and a display unit 2 formed on the substrate 1. In the transparent display device, external light can be incident on the substrate 1 by penetrating through the display unit 2 so that a user located at an image-forming side can view the image formed on an upper exterior side of the substrate 1. According to the embodiment illustrated in FIG. 1, the display device is a bottom emission type in which an image of the display unit 2 is formed toward the substrate 1, but the described technology is not limited thereto.

Figure 2:
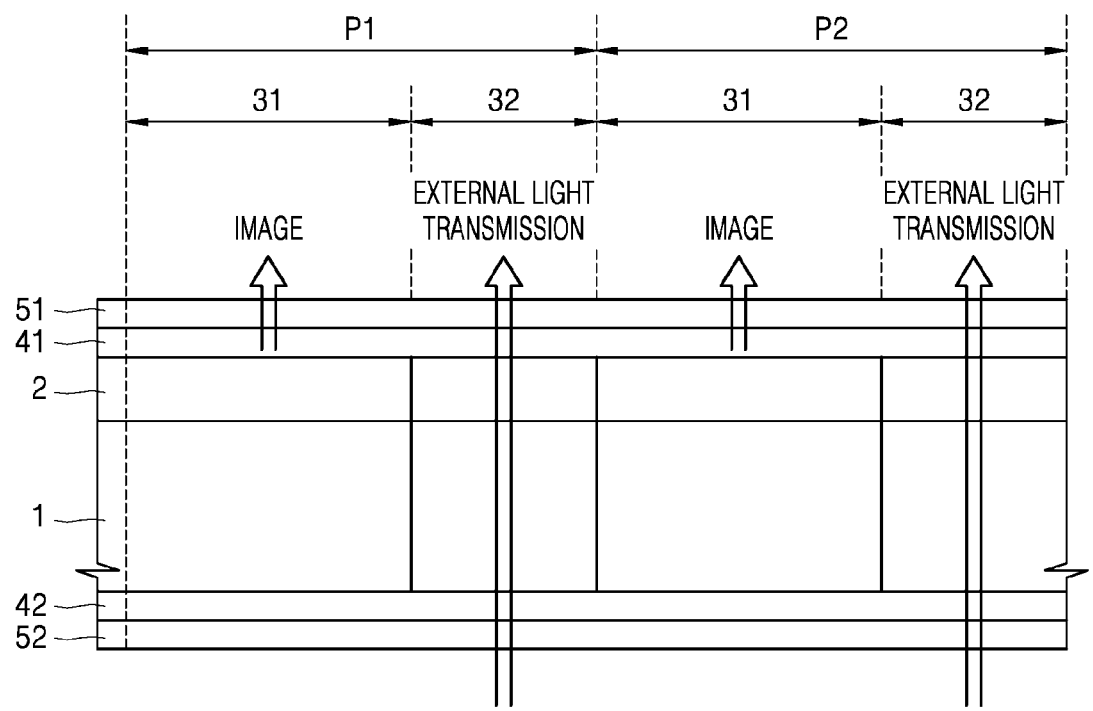
FIGS. 2 and 3 are schematic cross-sectional views of examples of the display device of FIG. 1 according to an embodiment.
Figure 3:
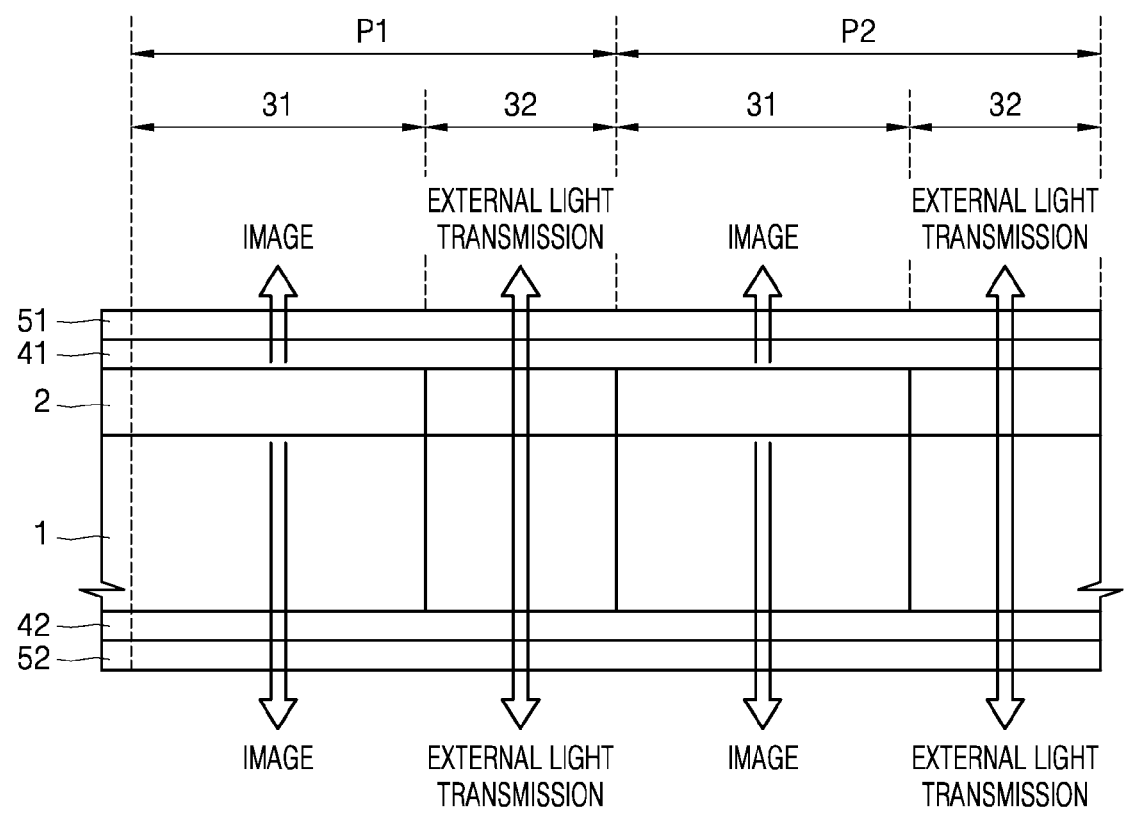

FIGS. 2 and 3 are schematic cross-sectional views of examples of the display device of FIG. 1 according to an embodiment.

As illustrated in FIG. 2, the display device can be a top emission type in which the image of the display unit 2 is formed away from the substrate 1. In some embodiments, the user can view the image from an upper side of the substrate 1. Alternatively, as illustrated in FIG. 3, the display device can be a dual emission type in which the image of the display unit 2 is formed both toward the substrate 1 and away from the substrate 1.

FIGS. 1 to 3 illustrate a first pixel P1 and a second pixel P2 of the transparent display device which are adjacent to each other.

Each of the first and second pixels P1 and P2 includes a first region 31 and a second region 32. The image is formed in the first region 31, and external light is transmitted through the second region 32. Accordingly, when the user is not viewing the image, the user can view an external image.

In some embodiments, display device components such as a thin film transistor (TFT), a capacitor, or an organic light-emitting diode (OLED) are not formed in the second region 32 so that external light transmittance can be increased. Accordingly, the external light transmittance of the display unit 2 can be increased, and the external image can be substantially prevented from being distorted due to the above-mentioned components.

Figure 4:
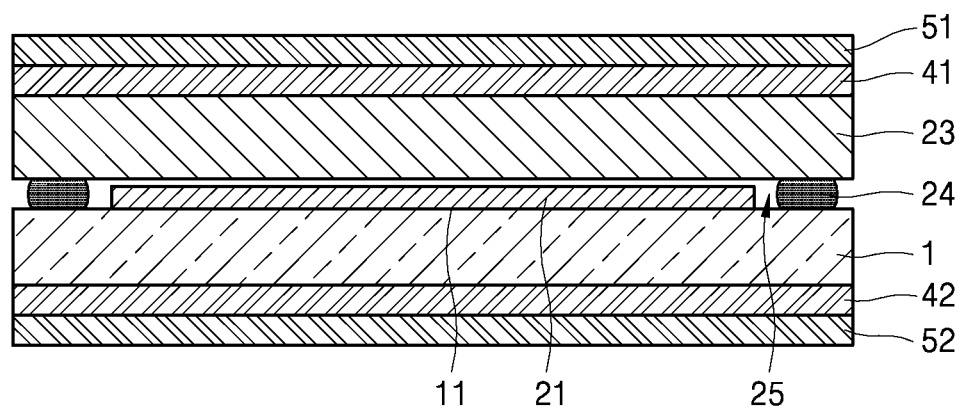
FIG. 4 is a detailed cross-sectional view of the device of FIGS. 1 to 3 according to an embodiment.

FIG. 4 is a detailed cross-sectional view of the device of FIGS. 1 to 3 according to an embodiment. Referring to FIG. 4, the display unit 2 includes an organic emission unit 21 formed on a first surface 11 of the substrate 1, and an encapsulating substrate 23 that encapsulates the organic emission unit 21.

The encapsulating substrate 23 can substantially block external air and moisture from penetrating into the organic emission unit 21. The encapsulating substrate 23 can be formed of a transparent material so that an image can be formed from the organic emission unit 21. Edges of the substrate 1 and the encapsulating substrate 23 are bonded by using an encapsulant 24 to encapsulate a space 25 that can be formed between the substrate 1 and the encapsulating substrate 23. A moisture absorbant (not shown) or filler (not shown) can be used to fill in the space 25.

Figure 5:
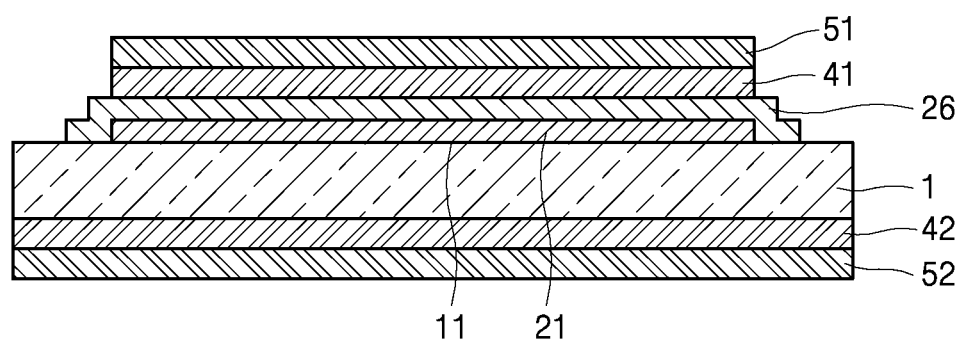
FIG. 5 is a detailed cross-sectional view of the device of FIGS. 1 to 3 according to an embodiment.

FIG. 5 is a detailed cross-sectional view of another embodiment of FIGS. 1 to 3.

As illustrated in FIG. 5, instead of the encapsulating substrate 23, an encapsulating film 26 can be formed on the organic emission unit 21 to substantially protect the organic emission unit 21 from external air. The encapsulating film 26 can have a stacked structure including a layer formed of an inorganic material, such as silicon oxide or silicon nitride, and a layer formed of an organic material, such as epoxy or polyimide. However, the structure and material of the encapsulating film 26 are not limited thereto. Although not illustrated, the organic emission unit 21 can be encapsulated by additionally forming the encapsulating substrate 23 of FIG. 4 on the encapsulating film 26 of FIG. 5.

When the display device is a bottom emission type, the first retarder 41 and the first linear polarizer 51 are sequentially formed on the upper side of the encapsulating substrate 23. The combination of the first linear polarizer 51 and the first retarder 41 transmits substantially circularly polarized light that rotates in a predetermined direction. The first linear polarizer 51 substantially linearly polarizes incident light in a predetermined direction. The first retarder 41 retards the incident light, for example, changes the phase of the light negatively by approximately a quarter of the wavelength ($-\lambda/4$).

In addition, the second retarder 42 and the second linear polarizer 52 are sequentially formed on the lower side of the substrate 1. The combination of the second linear polarizer 52 and the second retarder 42 transmits the substantially circularly polarized light. The second linear polarizer 52 substantially linearly polarizes incident light in a predetermined direction, and the second retarder 42, which is attached at a location where the light is emitted from the OLED, retards the incident light, for example, changes the phase of the light positively by approximately a quarter of the wavelength ($+\lambda/4$).

When the display device is a top emission type, the first retarder 41 and the first linear polarizer 51 are sequentially disposed at the outer side of the encapsulating substrate 23. A combination of the first linear polarizer 51 and the first retarder 41 transmits the circularly polarized light that rotates in a predetermined direction. The first linear polarizer 51 substantially linearly polarizes incident light in a predetermined direction. The first retarder 41, which is formed where the light is emitted from the OLED, changes the phase of the light by $+\lambda/4$.

In addition, the second retarder 42 and the second linear polarizer 52 are disposed at the outer side of the substrate 1. A combination of the second linear polarizer 52 and the second retarder 42 transmits the circularly polarized light that rotates in a predetermined direction. The second linear polarizer 52 substantially linearly polarizes incident light in a predetermined direction, and the first retarder 41 changes the phase of the light by $-\lambda/4$.

According to an embodiment, the combination of the first linear polarizer 51 and the first retarder 41, or the combination of the second linear polarizer 52 and the second retarder 42 can transmit left circularly polarized light or right circularly polarized light to reduce external light reflection on an image-displaying side of the display device. As a result, the user can see the image clearly. The first retarder 41 and the second retarder 42 can have substantially the same absolute value but rotate in different directions.

Hereinafter, the organic emission unit 21 will be described in more detail.

Figure 6:
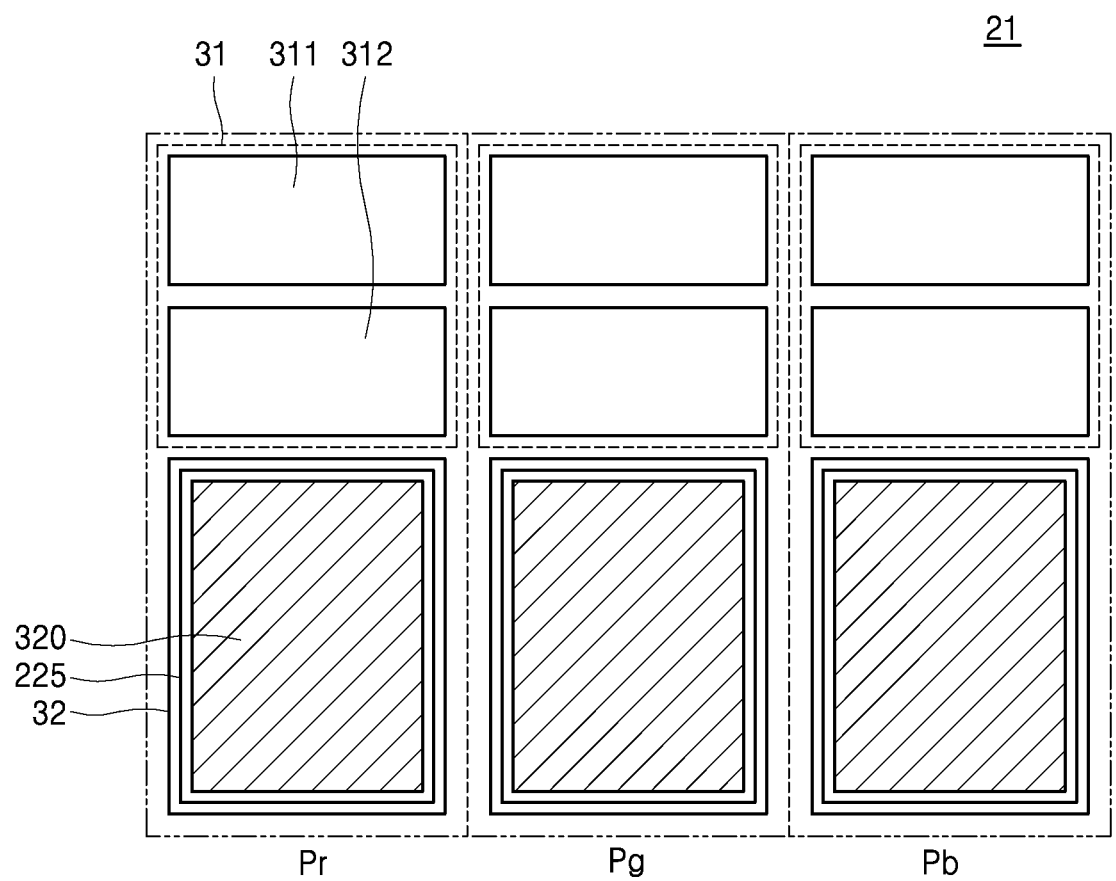
FIG. 6 is a schematic plan view of an organic emission unit of FIG. 4 or 5, according to an embodiment.

FIG. 6 is a schematic plan view of the organic emission unit 21 of FIG. 4 or 5 according to an embodiment. FIG. 6 illustrates a red pixel Pr, a green pixel Pg, and a blue pixel Pb of the organic emission unit 21 which are adjacent to one another.

The red pixel Pr, the green pixel Pg, and the blue pixel Pb each can include a circuit area 311 and an emission area 312 in the first region 31. The circuit area 311 substantially overlaps the emission area 312. The second region 32 is formed adjacent to the first region 31.

Figure 7:
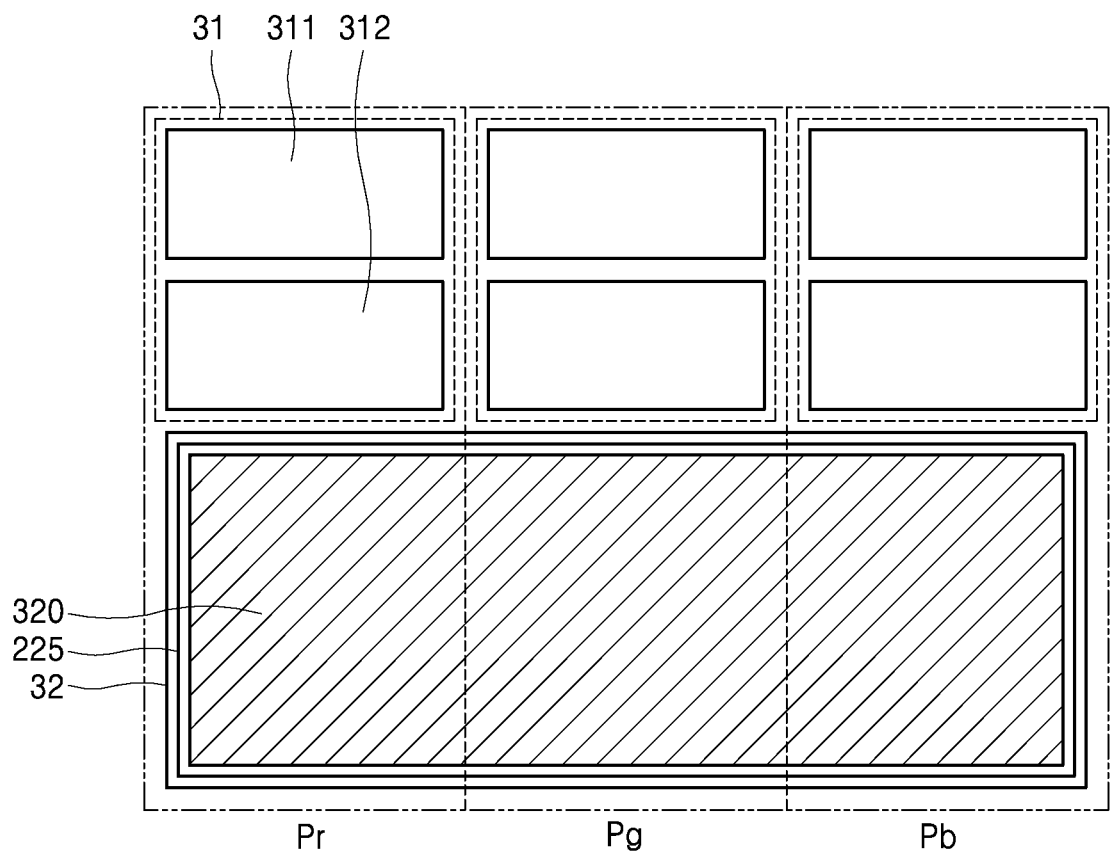
FIG. 7 is a schematic plan view of an organic emission unit of FIG. 4 or 5, according to another embodiment.

As illustrated in FIG. 6, the second region 32 can be separately formed for each of the red, green, and blue pixels Pr, Pg, and Pb. However, as illustrated in FIG. 7, the second region 32 can be connected to the red, green, and blue pixels Pr, Pg, and Pb. According to an embodiment, the size of the second region 32 is larger, and thus, the external light transmittance of the display unit 2 can be increased.

Although in FIG. 7, it is illustrated that the second region 32 of the red, green, and blue pixels Pr, Pg, and Pb is connected, embodiments of the described technology are not limited thereto. Alternatively, the second region 32 of any two adjacent pixels among the red, green, and blue pixels Pr, Pg, and Pb can be connected.

According to an embodiment, a liquid crystal device 320 is formed in the second region 32. The liquid crystal device 320 is a device that includes liquid crystals, and can substantially allow or block external light transmission with a first polarizer (the combination of the first linear polarizer 51 and the first retarder 41) and a second polarizer (the combination of the second linear polarizer 52 and the second retarder 42) corresponding to a predetermined mode. When the second region 32 is separately formed as in FIG. 6, the liquid crystal device 320 can also be separately formed like the second region 32. However, when the second region 32 connected as in FIG. 7, the liquid crystal device 320 can also be connected to the red, green, and blue pixels Pr, Pg, and Pb.

Figure 8:
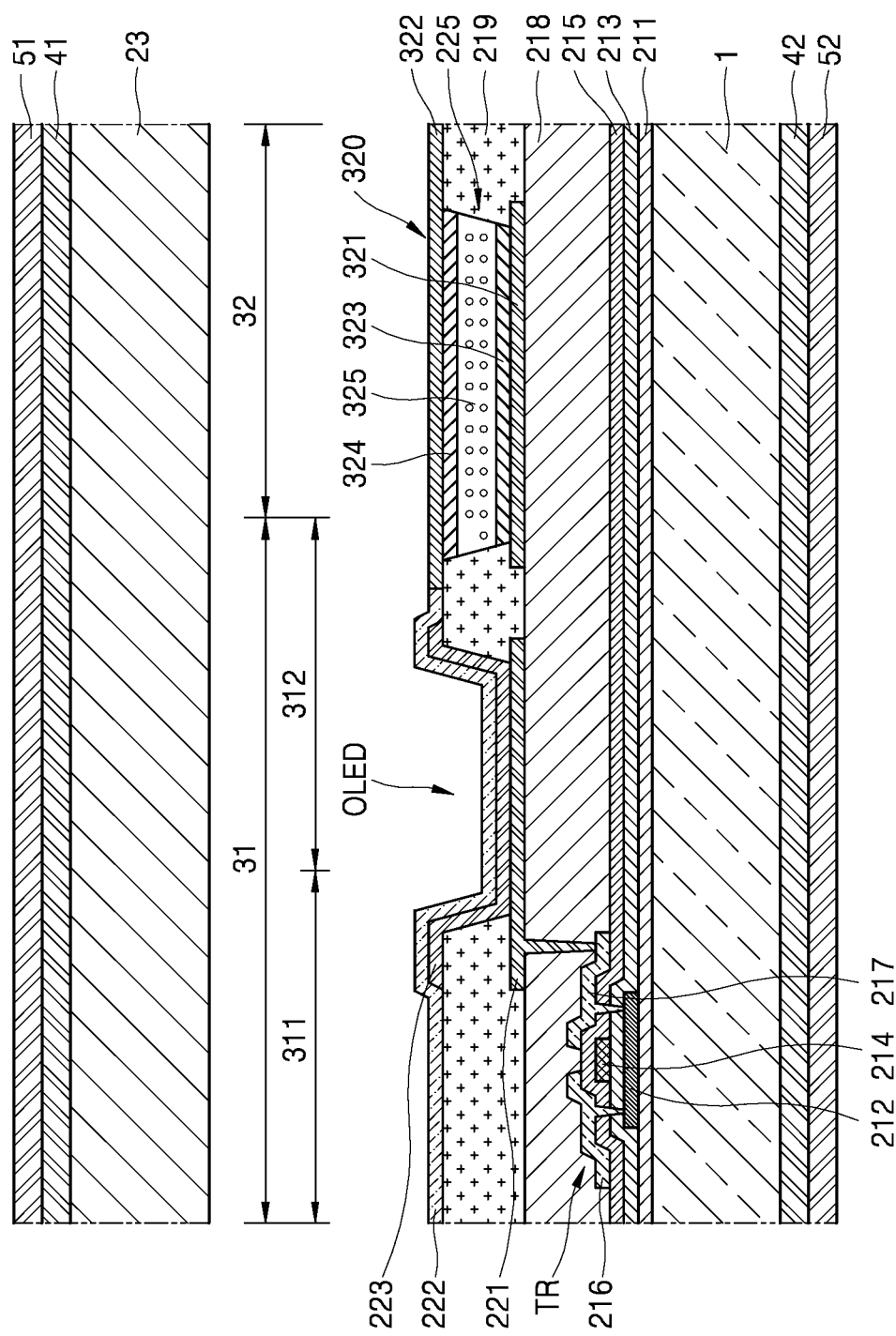
FIG. 8 is a cross-sectional view of a pixel of the organic emission unit of FIG. 4 or 5.

FIG. 8 is a cross-sectional view of a pixel among the red, green, and blue pixels Pr, Pg, and Pb of FIG. 6 or 7.

As illustrated in FIG. 8, a TFT TR is formed in the circuit area 311, but is not limited to only one TFT TR. A pixel circuit PC including the TFT TR can be formed. The pixel circuit PC can further include a plurality of TFTs, a storage capacitor and various wirings such as scan lines, data lines and Vdd lines that are electrically connected to the TFTs and the storage capacitor.

An OLED is formed in the emission area 312 and electrically connected to the TFT TR.

A buffer layer 211 is formed on the substrate 1. The pixel circuit PC is formed on the buffer layer 211.

A semiconductor active layer 212 can be formed on the buffer layer 211.

The buffer layer 211 is formed of a transparent insulating material and can substantially prevent impurities from penetrating a surface of the substrate 1. The buffer layer 211 can also planarize the surface. The buffer layer 211 can be formed of an inorganic material such as silicon oxide, silicon nitride, silicon oxynitride, aluminum oxide, aluminum nitride, titanium oxide, or titanium nitride, an organic material such as polyimide, polyester, acryl or a combination thereof. The buffer layer 211 can have a stacked structure formed of the inorganic material and the organic material.

The semiconductor active layer 212 can be formed of polycrystalline silicon or an oxide semiconductor, but is not limited thereto. For example, the semiconductor active layer 212 can be a G-I-Z-O layer (an $(In_2O_3)a(Ga_2O_3)b(ZnO)c$ layer, where a, b, and c are real numbers that respectively satisfy $a \geq 0$, $b \geq 0$, and $c > 0$). When the semiconductor active layer 212 is formed of oxide semiconductor, light transmittance in the circuit area 311 can be increased. Accordingly, the external light transmittance of the display unit 2 can be increased. A gate insulating layer 213 can be formed on the buffer layer 211. The buffer layer 211 can be formed of a transparent insulating material, and substantially cover the semiconductor active layer 212. A gate electrode 214 is formed on the gate insulating layer 213.

An interlayer insulating layer 215 is formed on the gate insulating layer 213 by using a transparent insulating material so as to substantially cover the gate electrode 214. A source electrode 216 and a drain electrode 217 can be formed on the interlayer insulating layer 215, and contact the semiconductor active layer 212 via a contact hole.

The TFT TR is not limited to a structure described above, and can have various TFT structures.

A passivation layer 218 is formed to substantially cover the pixel circuit PC. The passivation layer 218 can be a single insulating layer or a plurality of insulating layers having a planarized top surface. The passivation layer 218 can be formed of a transparent inorganic and/or transparent organic insulating material. The passivation layer 218 can be connected to all pixels.

As illustrated in FIG. 8, a first electrode 221 of the OLED that is electrically connected to the TFT TR is formed on the passivation layer 218. The first electrode 221 is formed separate and independent in each pixel.

A pixel-defining layer (PDL) 219 is formed on the passivation layer 218. The PDL 219 can be formed of an organic and/or inorganic insulating material.

The PDL 219 can be formed such that one or more edges of the first electrode 221 is substantially covered and the center of the first electrode 221 is exposed. The PDL 219 can cover a portion of the first region 31, but not such that the first region 31 is completely covered.

An organic layer 223 and a second electrode 222 are sequentially stacked on the first electrode 221. The second electrode 222 substantially covers the organic layer 223 and the PDL 219, and is electrically connected to all pixels.

The organic layer 223 can be formed of a low-molecular weight or polymer organic material. When the organic layer 223 is formed of the low-molecular weight organic material, the organic layer 223 includes an emission layer (EML). Alternatively, the organic layer 223 can further include at least one of a hole injection layer (HIL), a hole transport layer (HTL), an electron transport layer (ETL), and an electron injection layer (EIL). The organic layer 223 can be formed of various organic materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic material can be formed by using a vacuum deposition method. The HIL, the HTL, the ETL, and the EIL are common layers that can be commonly formed in the red, green, and blue pixels Pr, Pg, and Pb.

The first electrode 221 can function as an anode electrode, and the second electrode 222 can function as a cathode electrode, or vice versa.

According to an embodiment, the first electrode 221 can be a transparent electrode, and the second electrode 222 can be a reflective electrode. The first electrode 221 can be formed of a material with a high work function, such as ITO, IZO, ZnO, or $In_2O_3$. Also, the second electrode 222 can be densely formed of a metal having a low work function, such as silver (Ag), magnesium (Mg), aluminum (Al), platinum (Pt), palladium (Pd), gold (Au), nickel (Ni), neodymium (Nd), iridium (Jr), chromium (Cr), lithium (Li), or calcium (Ca). Therefore, in some embodiments, the OLED is a bottom emission type that forms images toward the first electrode 221.

However, the embodiments are not limited thereto, and the second electrode 222 can also be a transparent electrode.

As described above, the passivation layer 218, the gate insulating layer 213, the interlayer insulating layer 215, and the PDL 219 can be formed by using transparent insulating film so that the external light transmittance can be increased.

The encapsulating substrate 23 can be formed on an upper side of the second electrode 222. As illustrated in FIG. 4, a filler or a moisture absorbant can be formed in a space between the encapsulating substrate 23 and the second electrode 222. A structure of encapsulating the display unit 2 is not limited to the structure formed by using the encapsulating substrate 23 as in FIG. 8, and can be a structure formed by using an encapsulating film as described with reference to FIG. 5.

According to the present embodiment, a transmission window 225 is formed in at least one of the PDL 219, the passivation layer 218, the interlayer insulating layer 215, the gate insulating layer 213, and the buffer layer 211. The transmission window 225 can be formed by removing a portion of the aforementioned insulating layers that corresponds to the second region 32. Two or more transmission windows 225 can be formed such that they at least partially overlap each other.

The transmission window 225 can be formed in an island pattern. The transmission window 225 can be separately formed for each of the red, green, and blue pixels Pr, Pg, and Pb as illustrated in FIG. 6. or formed connected to the red, green, and blue pixels Pr, Pg, and Pb as illustrated in FIG. 7. FIG. 7 illustrates that the transmission window 225 is formed throughout and connected to the red, green, and blue pixels Pr, Pg, and Pb. However, the embodiments of the described technology are not limited thereto, and can be formed throughout and connected to any two adjacent pixels among the red, green, and blue pixels Pr, Pg, and Pb.

According to an embodiment, as illustrated in FIGS. 6 and 7, the liquid crystal device 320 is formed in the second region 32. The liquid crystal device 320 can include a third electrode 321, a fourth electrode 322, and a liquid crystal layer 325 formed between the third and fourth electrodes 321 and 322.

The third electrode 321 is formed in the second region 32. Referring to FIG. 8, the third electrode 321 can be formed on the passivation layer 218. The transmission window 225 is formed such that the PDL 219 substantially covers one or more edges of the third electrode 321 and exposes the center of the third electrode 321. However, the embodiments of the described technology are not limited thereto. When the transmission window 225 is formed in the passivation layer 218 and the PDL 219, the third electrode 321 can be formed on the interlayer insulating layer 215. When the transmission window 225 is formed in the interlayer insulating layer 215, the passivation layer 218, and the PDL 219, the third electrode 321 can be formed on the gate insulating layer 213. The third electrode 321 can be formed at various locations depending on a location of the transmission window 225.

The third electrode 321 is formed as a transparent electrode. For example, the third electrode 321 can be formed of a transparent conductive oxide material, such as TTO, IZO, ZnO, or $In_2O_3$. In some embodiments, the liquid crystal device 320 needs to have a high light transmittance so as to be capable of adjusting the external light transmittance over a large range. Accordingly, the third electrode 321 is formed of a transparent material having a high light transmittance.

The third electrode 321 can be formed as an island that is separated and independent in each pixel, but is not limited thereto. The third electrode 321 can be connected to all pixels. When the third electrode 321 is connected to all pixels, the third electrode 321 can be a line electrode that traverses the second region 32 of pixels in a row. When the third electrode 321 is formed as an island, a switching TFT or a bridge electrode can be electrically connected to each third electrode 321. The third electrode 321 can receive a voltage or a signal for turning on/off the liquid crystal device 320 directly or via the switching TFT or the bridge electrode. A voltage or a signal that is applied to the first electrode 221 is not the same as that of the third electrode 321.

The fourth electrode 322 is formed such that the liquid crystal layer 325 is formed between the third and the fourth electrodes 321 and 322. The fourth electrode 322 is electrically connected to a plurality of pixels. In a bottom emission type, because the second electrode 222 is a reflective electrode, the fourth electrode 322 is formed separately from the second electrode 222. The fourth electrode 322 is formed as a semi-transparent electrode through which light can be transmitted, or as a transparent electrode. For example, the fourth electrode 322 can be a thin film metal layer formed of Ag, Mg, Al, Pt, Pd, Au, Ni, Nd, Ir, Cr, Li, or Ca, or formed of a transparent conductive oxide material, such as ITO, IZO, ZnO, or $In_2O_3$. In some embodiments, the fourth electrode 322 can be electrically connected to the second electrode 222.

The third and fourth electrodes 321 and 322 can substantially maintain the distance therebetween in which a phase of transmitted light can be changed by about 90° ($\lambda/2$).

The liquid crystal layer 325 can be formed between the third and fourth electrodes 321 and 322. An alignment of the liquid crystal layer 325 changes when an electric field is applied. Because the liquid crystals change in response to a voltage difference, the liquid crystals can generate a substantially uniform phase difference with respect to substantially the entire area, consume less power, and be inexpensive. According to the present embodiment, the liquid crystal layer 325 is a vertical alignment nematic (VAN) type. The liquid crystals can change incident light positively by approximately 0 to approximately half of the wavelength ($+\lambda/2$). However, this is only an example, and the liquid crystal layer 325 can be an in-plane switching (IPS) type or a plane to line switching (PLS) type.

A first alignment layer 323 is formed between the third electrode 321 and the liquid crystal layer 325 in a predetermined direction by a rubbing process or a photoalignment process. A second alignment layer 324 is formed between the fourth electrode 322 and the liquid crystal layer 325 by a rubbing or photoalignment process. The first and second alignment layers 323 and 324 are formed as vertical alignment layers by a rubbing or photoalignment process. Therefore, when an electric field is not applied, the liquid crystals are substantially perpendicular to surfaces of the first and second alignment layers 323 and 324. Alternatively, according to another embodiment, the liquid crystal layer 325 can be divided into a plurality of domains so that the liquid crystals can be substantially perpendicularly aligned without the alignment layers and/or an electric field. The first and second alignment layers 323 and 324 and the liquid crystal layer 325 are substantially separated from the outside by an encapsulation process.

Hereinafter, referring to FIGS. 9 and 10, operations of the liquid crystal device 320 and linear polarizer according to modes of the display device will be described.

Figure 9:
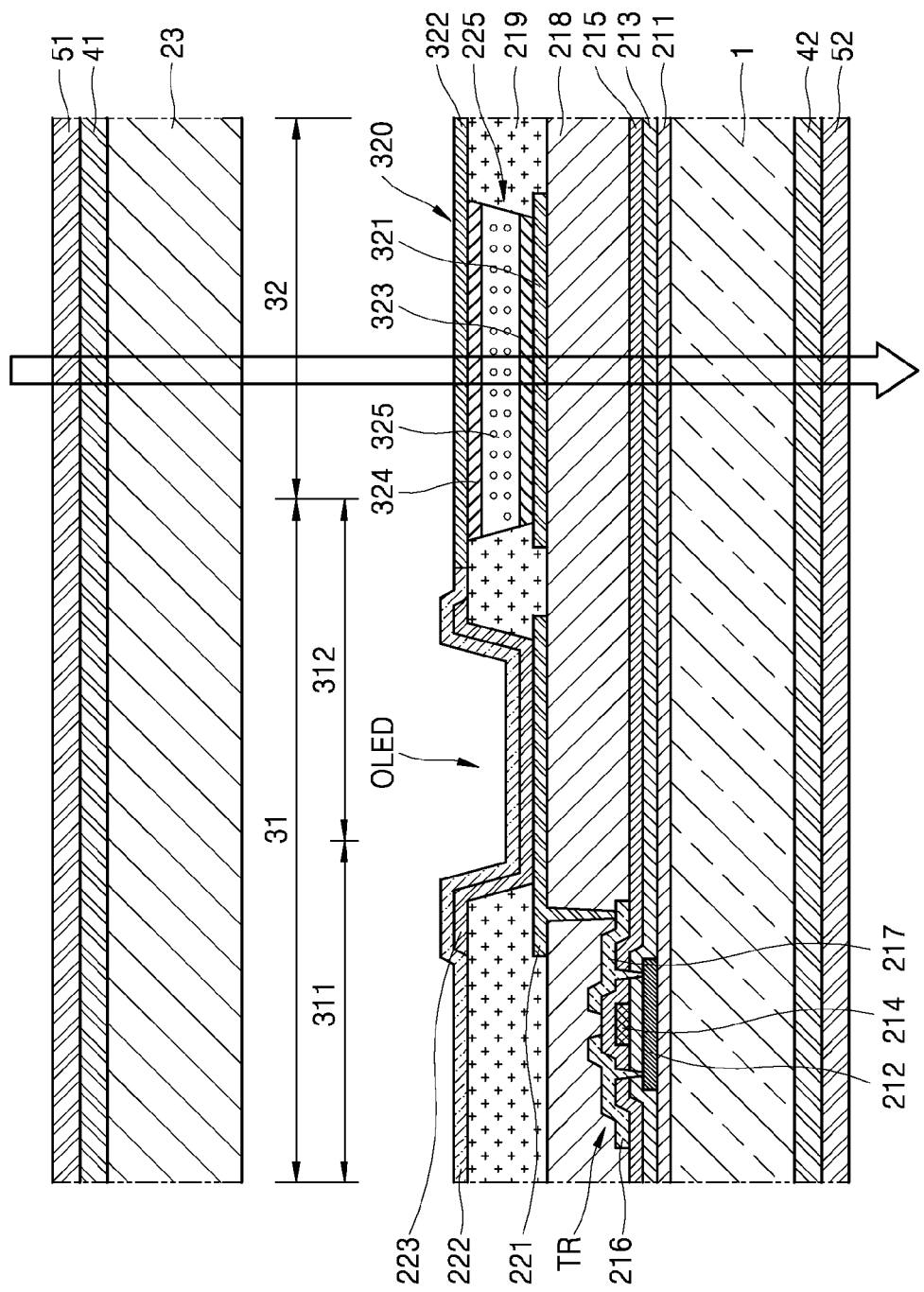
FIGS. 9 and 10 are cross-sectional views showing operations of the organic emission unit of FIG. 4 or 5.

FIG. 9 illustrates the display device in a transmission mode. In the transmission mode, the second region 32 is in a state where external light penetrates through the display device so that external light is transmitted.

When extension axes are substantially perpendicular to each other, the first retarder 41 changes the phase of the incident light by $-\lambda/4$, and the second retarder 42 changes the phase of the incident light by $+\lambda/4$. Accordingly, the first and second retarders 41 and 42 substantially offset each other. When respective absorption axes of the first and second linear polarizers 51 and 52 are substantially perpendicular to each other and VAN liquid crystals are substantially horizontally aligned with respect to surfaces of the third and fourth electrodes 321 and 322 (i.e., the liquid crystals when the incident light has a phase change of by $+\lambda/2$), external light penetrates into the second region 32. When an electric field is applied between the third and fourth electrodes 321 and 322, the VAN liquid crystals are substantially horizontally aligned with respect to the surfaces of the third and fourth electrodes 321 and 322. Thus, voltages are applied to the third electrode 321.

In a case where the extension axis are perpendicular to each other, the first retarder 41 retards the phase of the incident light by −¼ wavelength (−λ/4), and the second retarder 42 retards the phase of the incident light by +¼ wavelength (+λ/4). Accordingly, the first and second retarders 41 and 42 offset each other. In some embodiments, when the respective absorption axes of the first and second linear polarizers 51 and 52 are substantially parallel to each other and the VAN liquid crystals are substantially vertically aligned with respect to surfaces of the third and fourth electrodes 321 and 322 (i.e., the liquid crystals when the phase of the light does not substantially change), external light penetrates into the second region 32. When the electric field is not applied between the third and fourth electrodes 321 and 322, the VAN liquid crystals are substantially vertically aligned with respect to the surfaces of the third and fourth electrodes 321 and 322. Thus, voltages are not applied to the third electrode 321.

Figure 10:
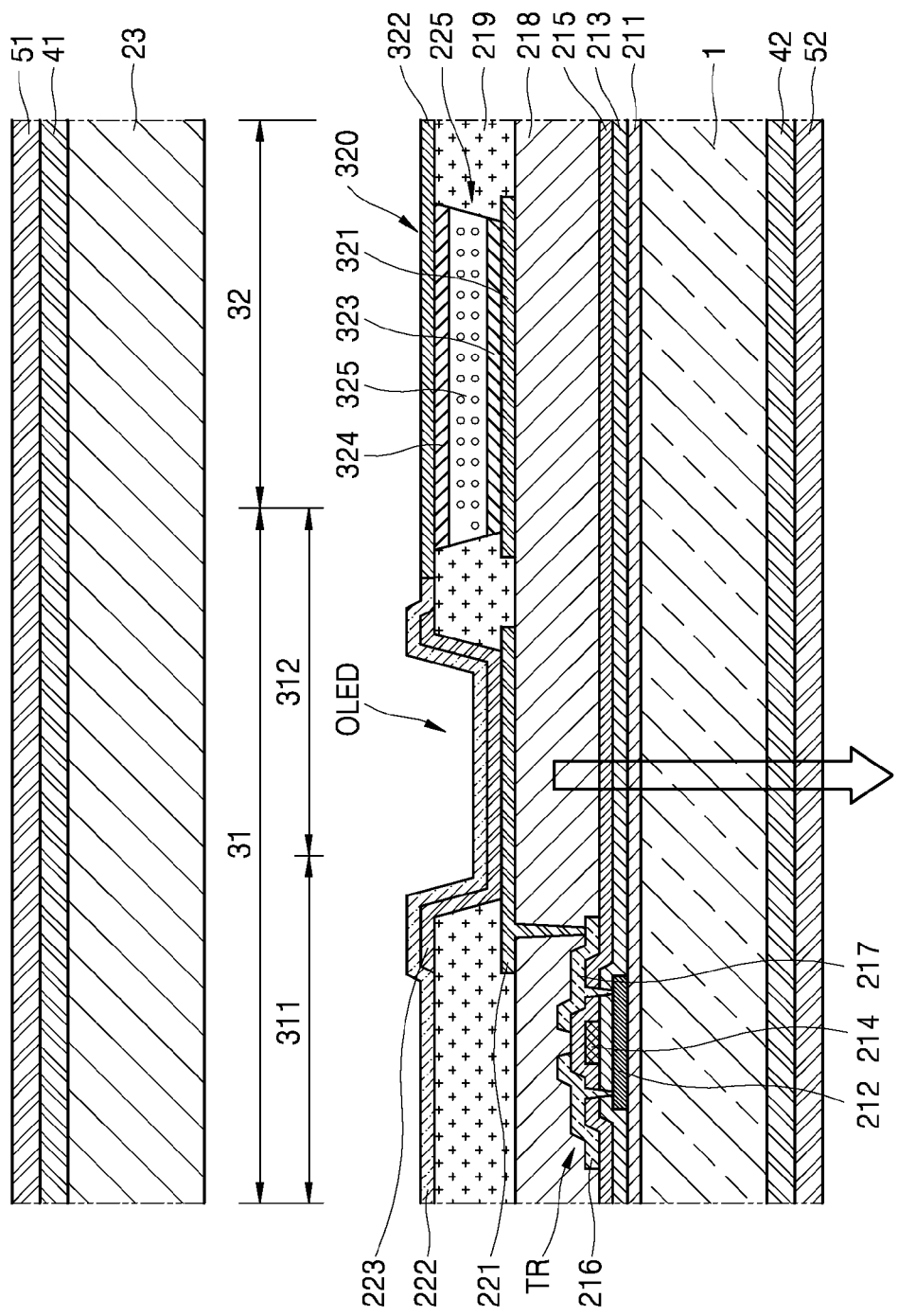

FIG. 10 illustrates the display device in a non-transmission mode. In the non-transmission mode, the display device substantially blocks external light. When the OLED is emitting light in the non-transmission mode, it is possible to substantially prevent image distortion or blurry colors.

In a case where extension axis are perpendicular to each other, the first retarder 41 retards the phase of the incident light by −¼ wavelength (−λ/4), and the second retarder 42 retards the phase of the incident light by +¼ wavelength (+λ/4). Accordingly, the first and second retarders 41 and 42 offset each other. When the extension axes are substantially perpendicular to each other, the first retarder 41 changes the phase of the light by −λ/4, and the second retarder 42 changes the phase of the light by +λ/4. Accordingly, the first and second retarders 41 and 42 substantially offset each other. When the respective absorption axes of the first and second linear polarizers 51 and 52 are substantially perpendicular to each other and the VAN liquid crystals are substantially vertically aligned with respect to surfaces of the third and fourth electrodes 321 and 322 (i.e., the liquid crystals when the phase of the incident light does not substantially change), external light does not penetrate into the second region 32. When the electric field is not applied between the third and fourth electrodes 321 and 322, the VAN liquid crystals are substantially vertically aligned with respect to the surfaces of the third and fourth electrodes 321 and 322. Thus, voltages are not applied to the third electrode 321.

When the respective absorption axes of the first and second linear polarizers 51 and 52 are substantially parallel to each other and the VAN liquid crystals are substantially horizontally aligned with respect to surfaces of the third and fourth electrodes 321 and 322 (i.e., the liquid crystals when the incident light changes by +λ/2), external light does not penetrate into the second region 32. When the electric field is applied between the third and fourth electrodes 321 and 322, the VAN liquid crystals are substantially horizontally aligned with respect to the surfaces of the third and fourth electrodes 321 and 322. Thus, the voltages are applied to the third electrode 321.

Figure 11:
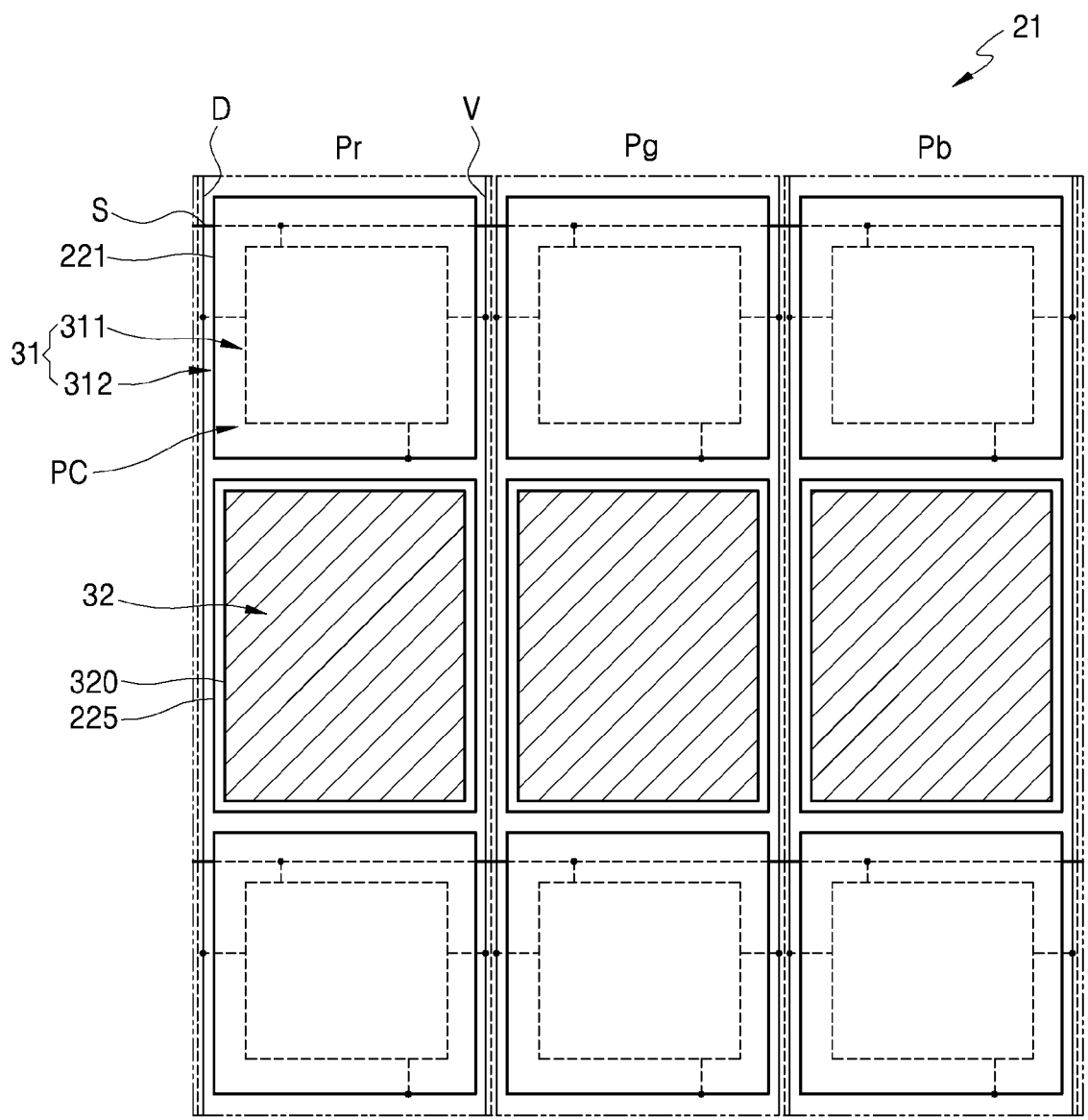
FIG. 11 is a schematic plan view of the organic emission unit of FIG. 4 or 5.

FIG. 11 is a plan view of the red, green, and blue pixels Pr, Pg, and Pb according to another embodiment.

The circuit area 311 and the emission area 312 are formed in the first region 31 of each of the red, green, and blue pixels Pr, Pg, and Pb. The circuit area 311 and the emission area 312 are formed such that the circuit area 311 and the emission area 312 substantially overlap each other. According to an embodiment illustrated in FIG. 11, the emission area 312 is larger than the pixel circuit PC of the circuit area 311, and thus, the pixel circuit PC is substantially completely covered by the emission area 312.

The second region 32 is formed adjacent to the first region 31. As illustrated in FIG. 11, the second region 32 can be separately formed for each of the red, green, and blue pixels Pr, Pg, and Pb.

A plurality of conductive lines such as scan lines S, data lines D, and Vdd lines V are electrically connected to the pixel circuit PC. Although not illustrated in FIG. 11, various conductive lines other than the scan lines S, the data lines D, and the Vdd lines V that are power drivers can be formed depending on configurations of the pixel circuit PC.

Figure 12:
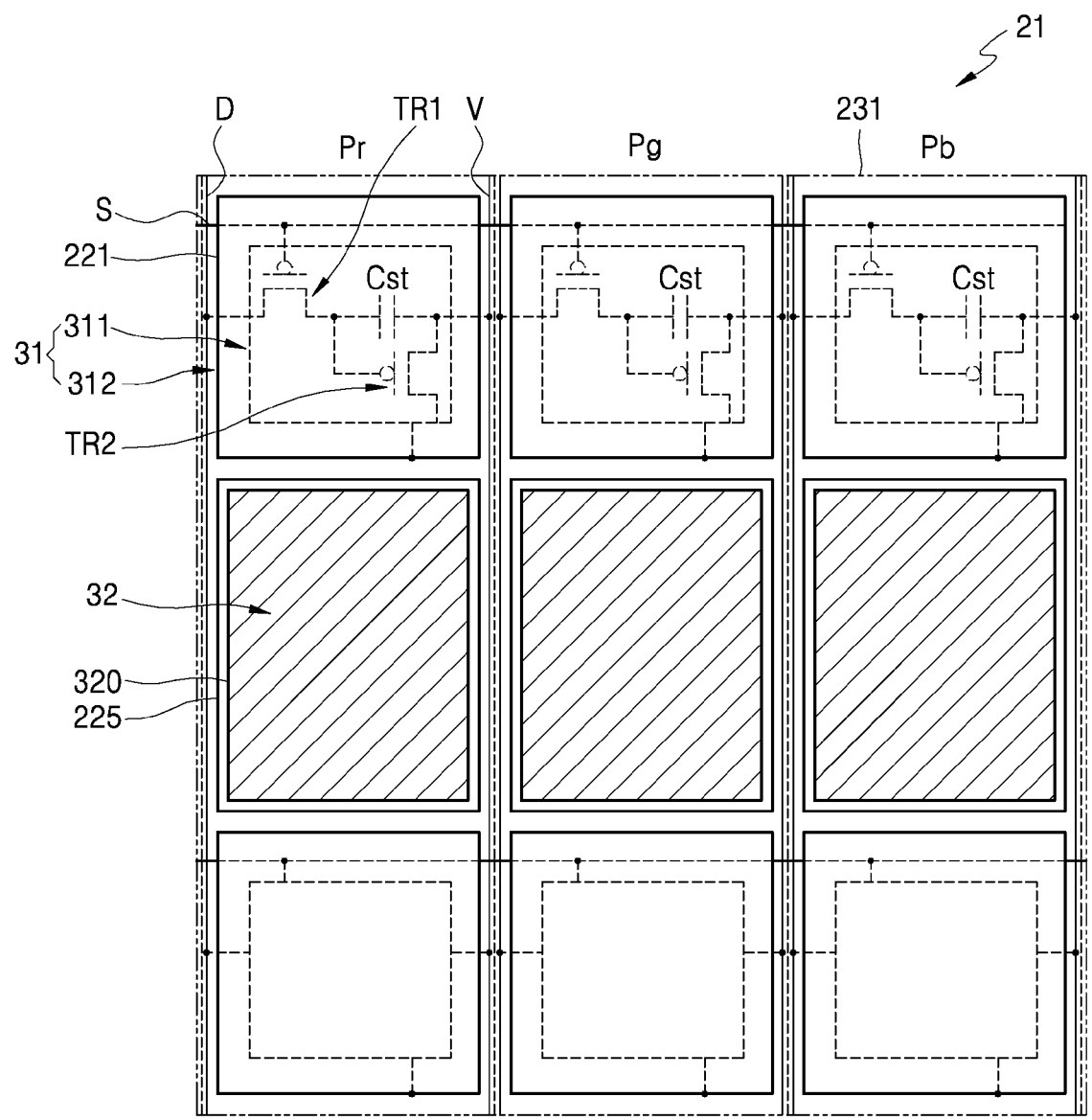
FIG. 12 is a schematic plan view of the organic emission unit including an example of a pixel circuit unit of FIG. 11.

FIG. 12 is a schematic plan view of an example of the pixel circuit PC of FIG. 11.

As illustrated in FIG. 12, the pixel circuit PC includes a first TFT TR1 electrically connected to the scan lines S and the data lines D, a second TFT TR2 electrically connected to the first TFT TR1 and the Vdd lines V, and a capacitor Cst electrically connected to the first and second TFTs TR1 and TR2. The first TFT TR1 is a switching transistor, and the second TFT TR2 is a driving transistor. The second TFT TR2 is electrically connected to the first electrode 221. In FIG. 12, the first and second TFTs TR1 and TR2 are illustrated as P-types, but are not limited thereto, and at least one of the first and second TFTs TR1 and TR2 can be N-type. The number of TFTs and capacitors is not limited to the illustrated embodiment. Two or more TFTs and one or more capacitors can be combined according to the pixel circuit PC.

Referring to FIGS. 11 and 12, the scan lines S are formed such that the scan lines S at least partially overlap the first electrode 221. However, the embodiments are not limited thereto. At least one of the conductive lines can be formed to at least partially overlap the first electrode 221. In some embodiments, all of the conductive lines can at least partially overlap or be formed adjacent to the first electrode 221.

According to some embodiments, the first and second regions 31 and 32 are separated so that when viewing the outside through the second region 32, it is possible to substantially prevent external image distortion that is caused when external light scatters in the pixel circuit PC.

The first and second regions 31 and 32 can be formed such that a ratio of an area of the second region 32 to a total area of the first and second regions 31 and 32 is in the range of about 5% and about 90%.

When the ratio is less than about 5% and the display unit 2 is off, the display unit 2 can transmit a small amount of light, and thus, the user may be unable to view an object or an image formed at the opposite side. That is, the display unit 2 is not transparent. When the ratio is about 5%, because the first region 31 is formed as an island with respect to the second region 32, and conductive patterns are formed in the first region 31, the display unit 2 is substantially transparent. The conductive patterns are formed in the first region 31 as much as possible to reduce a degree of scattering of sunlight. In addition, when a TFT in the pixel circuit PC is transparent TFT formed of oxide semiconductor, and an OLED is formed of transparent materials, the display unit 2 can be more transparent.

When the ratio is more than about 90%, a pixel density of the display unit 2 can be reduced too much such that it is difficult to form a stable image from light emitted in the first region 31. That is, as the area of the first region 31 decreases, a brightness of light emitted from the organic layer 223 needs to increase to form an image. When the OLED is operated in a high brightness mode, the lifespan of the OLED is greatly reduced. Also, when the area of the first region 31 is maintained and the ratio is greater than about 90%, resolution is reduced. However, depending on embodiments, the ratio can be less than about 5% or greater than about 90%.

The ratio can be in the range of about 20% to about 70%.

When the ratio is less than about 20%, because the first region 31 is much larger than the second region 32, the user may be unable to view the external image through the second region 32. When the ratio is more than about 70%, there can be a limitation to a design of the pixel circuit PC. However, depending on embodiments, the ratio can be less than about 20% or greater than about 70%.

The first electrode 221 is formed in the first region 31, and the pixel circuit PC at least partially overlaps the first electrode 221 such that the pixel circuit PC is substantially covered by the first electrode 221. Also, at least one of the conductive lines can be electrically connected to the first electrode 221. Because a probability of the conductive lines reducing the light transmittance is less than that of the pixel circuit PC, the conductive lines can all be formed adjacent to the first electrode 221 depending on design conditions. The first electrode 221 includes a reflective film that is formed of a conductive metal that can reflect light. Thus, the first electrode 221 can substantially block the pixel circuit PC, and substantially prevent the external image from being distorted due to the pixel circuit PC.

Figure 13:
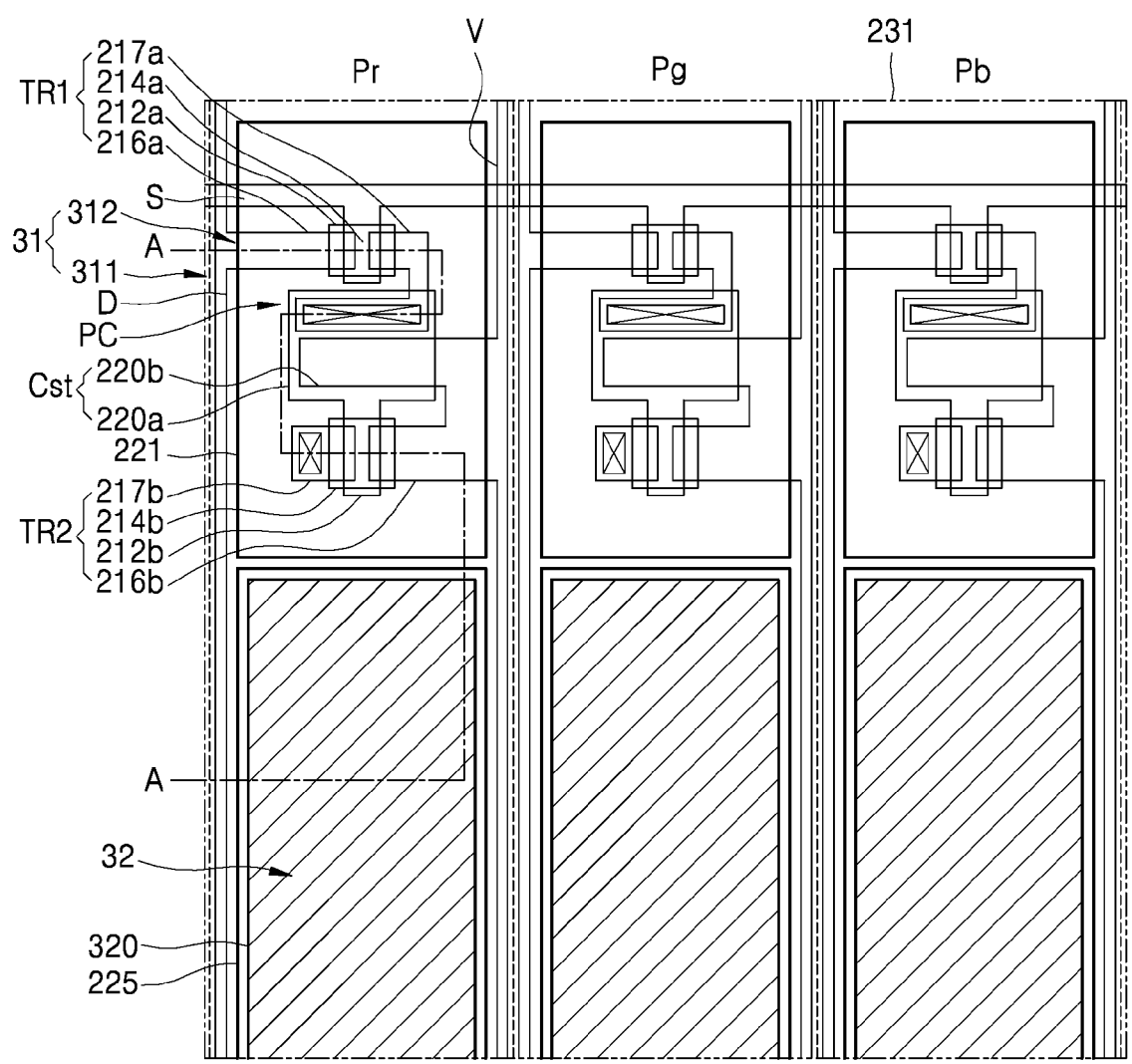
FIG. 13 is a detailed plan view of the organic emission unit of FIG. 12.
Figure 14:
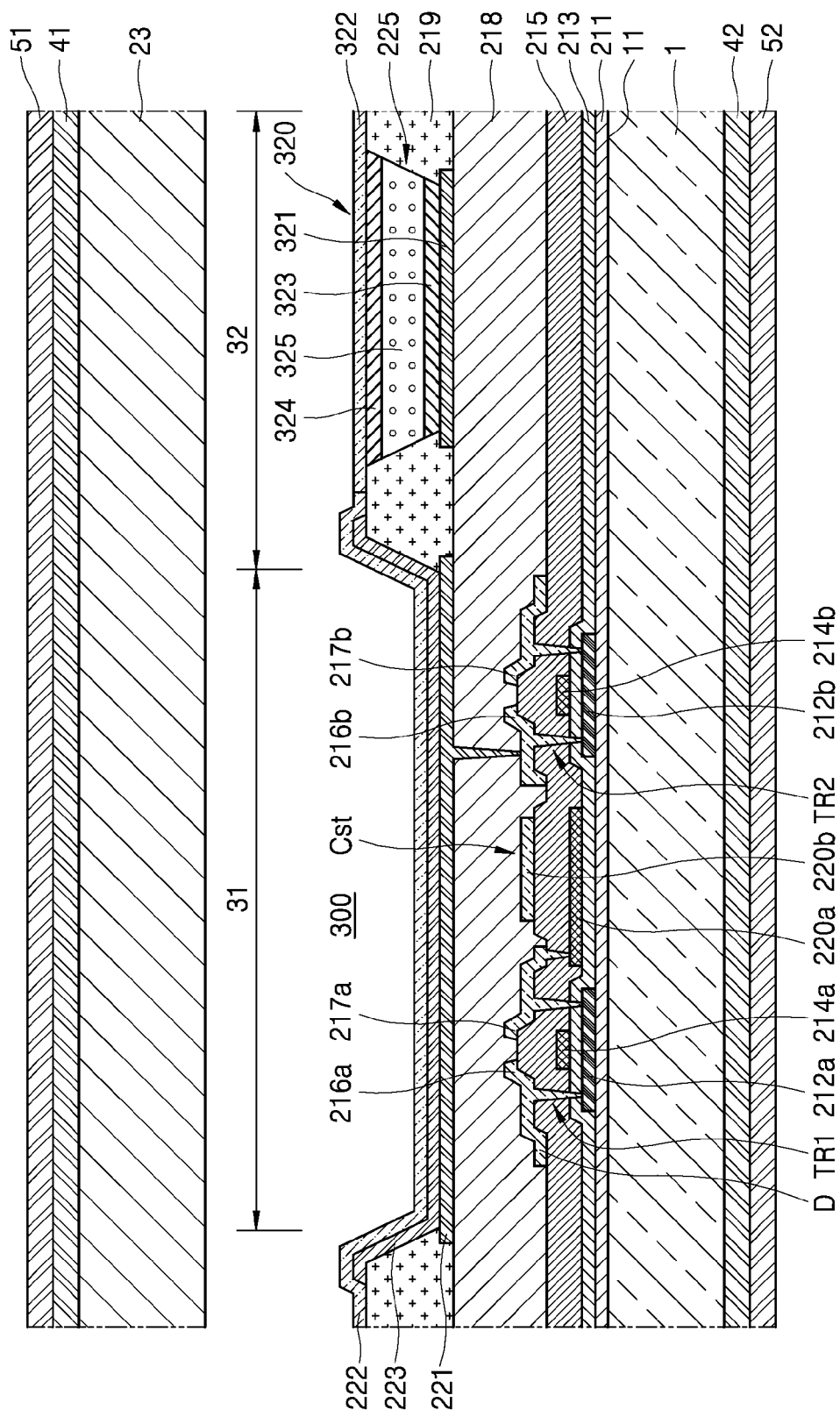
FIG. 14 is a cross-sectional view along the line A-A of the organic emission unit of FIG. 13.

FIG. 13 is a plan view of the organic emission unit 21 according to an embodiment, which shows the pixel circuit PC of FIG. 12. FIG. 14 is a cross-sectional view along line A-A of the organic emission unit 21 of FIG. 13.

According to FIGS. 13 and 14, the buffer layer 211 is formed on the first surface 11. The first TFT TR1, the capacitor Cst, and the second TFT TR2 are formed on the buffer layer 211.

A first semiconductor active layer 212a and a second semiconductor active layer 212b are formed on the buffer layer 211.

The first and second semiconductor active layers 212a and 212b can be formed of polycrystalline silicon, but the described technology is not limited thereto, and they can be formed of oxide semiconductor. For example, the first and second semiconductor active layers 212a and 212b can be G-I-Z-O layers ($(In_2O_3)a(Ga_2O_3)b(ZnO)c$ layers, where a, b, and c are real numbers that respectively satisfy a≥0, b≥0, and c>0).

The gate insulating layer 213 is formed on the buffer layer 211 to substantially cover the first and second semiconductor active layers 212a and 212b. A first gate electrode 214a and a second gate electrode 214b are formed on the gate insulating layer 213.

The interlayer insulating layer 215 is formed on the gate insulating layer 213 to substantially cover the first and second gate electrodes 214a and 214b. A first source electrode 216a and a first drain electrode 217a are formed on the interlayer insulating layer 215 to be electrically connected to the first semiconductor active layer 212a via contact holes. Also, a second source electrode 216b and a second drain electrode 217b are formed on the interlayer insulating layer 215 to be electrically connected to the second semiconductor active layer 212b via contact holes.

Scan lines S and the first and second gate electrodes 214a and 214b can be substantially simultaneously formed. Data lines D and the first source electrode 216a are substantially simultaneously formed to be electrically connected to the first source electrode 216a. The Vdd lines V and the second source electrode 216b are substantially simultaneously formed to be electrically connected to the second source electrode 216b.

Regarding the capacitor Cst, a lower electrode 220a and the first and second gate electrodes 214a and 214b can be substantially simultaneously formed. Also, an upper electrode 220b and the first drain electrode 217a can be substantially simultaneously formed.

The structures of the first TFT TR1, the capacitor Cst, and the second TFT TR2 are not limited to the description above. Various TFTs and capacitors can be used as the first TFT TR1, the capacitor Cst, and the second TFT TR2. For example, the first and second TFTs TR1 and TR2 can be of a bottom gate type in which the first and second gate electrodes 214a and 214b are respectively formed below the first and second semiconductor active layers 212a and 212b. Other TFTs can be used as the first and second TFTs TR1 and TR2.

The passivation layer 218 is formed to substantially cover the first TFT TR1, the capacitor Cst, and the second TFT TR2. The passivation layer 218 can be a single insulating layer or a plurality of insulating layers having a planarized top surface. The passivation layer 218 can be formed of an inorganic and/or organic material.

As illustrated in FIGS. 13 and 14, the first electrode 221 is formed on the passivation layer 218 to substantially cover the first TFT TR1, the capacitor Cst, and the second TFT TR2. The first electrode 221 is electrically connected to the second source electrode 216b or drain electrode 217b of the second TFT TR2 through a via hole formed in the passivation layer 218. As illustrated in FIG. 13, the first electrode 221 is formed as an island in each pixel.

The PDL 219 is formed on the passivation layer 218 to substantially cover one or more of the edges of the first electrode 221.

The organic layer 223 and the second electrode 222 are sequentially stacked on the first electrode 221. The second electrode 222 is formed over the first region 31 and the second region 32.

The first electrode 221 is formed in each pixel such that a size of the first electrode 221 corresponds to the first region 31. The second electrode 222 can be formed as a common electrode so that all pixels of the organic emission unit 21 are substantially covered.

According to an embodiment, the first electrode 221 can be a reflective electrode, and the second electrode 222 can be a semi-transparent electrode. Therefore, the organic emission unit 21 can be a top emission type in which an image is formed toward the second electrode 222.

Accordingly, the first electrode 221 can include a reflective film formed of Ag, Mg, Al, Pt, Pd, Au, Ni, Nd, Jr, Cr, Li, Ca or a combination thereof, and TTO, IZO, ZnO, or $In_2O_3$ having a low work function. The second electrode 222 can be formed of metal having a low work function, such as Ag, Mg, Al, Pt, Pd, Au, Ni, Nd, Jr, Cr, Li, Ca or a combination thereof. The second electrode 222 can be formed as a thin film so that the light transmittance thereof is high.

When the first electrode 221 is a reflective electrode, the pixel circuit PC is substantially covered by the first electrode 221. Therefore, referring to FIG. 14, the user does not see from an upper exterior side of the second electrode 222 respective patterns of the first TFT TR1, the capacitor Cst, and the second TFT TR2, and a portion of the scan lines S, the data lines D, and the Vdd lines V.

When the first electrode 221 is a reflective electrode, light is emitted only toward a viewer. Thus, light that is incident away from the viewer can be reduced. Also, as described above, because the first electrode 221 can substantially cover various patterns of the pixel circuit PC, the viewer can see a transmitted image more clearly.

The passivation layer 218, the gate insulating layer 213, the interlayer insulating layer 215, and the PDL 219 can be transparent insulating layers.

According to the present embodiment, the transmission window 225 is formed in at least one of the PDL 219, the passivation layer 218, the interlayer insulating layer 215, the gate insulating layer 213, and the buffer layer 211. The transmission window 225 may be formed by removing portions of the interlayer insulating layer 215 and the gate insulating layer 213 that correspond to the second region 32. Two or more transmission windows 225 may be formed to overlap each other.

The transmission window 225 may be formed as an island pattern. As illustrated in FIGS. 13 and 14, the transmission window 225 may be separately provided for each of the red, green, and blue pixels Pr, Pg, and Pb.

According to an embodiment of the present invention, as illustrated in FIGS. 11 to 13, the liquid crystal device 320 is provided in the second region 32. The liquid crystal device 320 may include the third and fourth electrodes 321 and 322, which face each other, and the liquid crystal layer 325 provided between the third and fourth electrodes 321 and 322.

The third electrode 321 is provided in the second region 32. Referring to FIG. 14, the third electrode 321 may be provided on the passivation layer 218, and the transmission window 225 is provided such that the PDL 219 covers an edge of the third electrode 321 and exposes the center of the third electrode 321. However, the embodiments of the present invention are not limited thereto. When the transmission window 225 is provided in the passivation layer 218 and the PDL 219, the third electrode 321 may be provided on the interlayer insulating layer 215. When the transmission window 225 is provided in the interlayer insulating layer 215, the passivation layer 218, and the PDL 219, the third electrode 321 may be provided on the gate insulating layer 213. The third electrode 321 may be provided at various locations depending on a location of the transmission window 225.

The third electrode 321 is provided as a transparent electrode. For example, the third electrode 321 may be formed by using a transparent conductive oxide material, such as TTO, IZO, ZnO, or $In_2O_3$. The liquid crystal device 320 needs to have a high light transmittance so as to be capable of adjusting the external light transmittance over as large as possible range. Accordingly, the third electrode 321 is formed by using a transparent material having a high light transmittance.

The third electrode 321 may be formed as an island that is separated and independent in each pixel, but is not limited to, and may be disposed throughout and connected to all pixels. When the third electrode 321 is disposed throughout and connected to all pixels, the third electrode 321 may be a line electrode that traverses the second region 32 of the pixels that are located in a single row. When the third electrode 321 is formed as an island, a switching TFT or a bridge electrode may be connected to each third electrode 321. The third electrode 321 may receive a voltage or a signal for turning on/off the liquid crystal device 320, directly or via the switching TFT or the bridge electrode. A voltage or a signal that is applied to the first electrode 221 is not the same as a voltage or signal applied to the third electrode 321.

The fourth electrode 322 is provided to face the third electrode 321. The fourth electrode 322 is provided such that the liquid crystal layer 325 is formed between the third and fourth electrodes 321 and 322. The fourth electrode 322 is formed to be disposed throughout and connected to a plurality of pixels, and may be connected to the second electrode 222. That is, the fourth electrode 322 is integrally formed with the second electrode 222, and thus, the fourth electrode 322 may be part of the second electrode 222. That is, the fourth electrode 322 may be formed as a thin film metal layer using Ag, Mg, Al, Pt, Pd, Au, Ni, Nd, Ir, Cr, Li, or Ca.

The third and fourth electrodes 321 and 322 may maintain a distance in which a phase of transmitted light may be changed by 90° ($\lambda/2$).

The liquid crystal layer 325 may be provided between the third and fourth electrodes 321 and 322. An alignment of the liquid crystal layer 325 changes when an electric field is applied. Since the liquid crystals change in response to a voltage difference, the liquid crystals may realize a uniform phase difference with respect to an entire area, consume less power, and be inexpensive. According to the present embodiment, the liquid crystal layer 325 is in a vertical alignment nematic (VAN) mode. The liquid crystals may retard incident light by 0 to +½ (+$\lambda/2$) wavelength. However, this is only an example, and the liquid crystal layer 325 may be in an in-plane switching (IPS) mode or a plane to line switching (PLS) mode.

The first alignment layer 323 is formed between the third electrode 321 and the liquid crystal layer 325 in a predetermined direction by a rubbing or photoalignment process. The second alignment layer 324 is formed between the fourth electrode 322 and the liquid crystal layer 325 by a rubbing or photoalignment process. The first and second alignment layers 323 and 324 are formed as vertical alignment layers by a rubbing or photoalignment process so that when an electric field is not applied, the liquid crystals are perpendicular to surfaces of the first and second alignment layers 323 and 324. Alternatively, according to another embodiment of the present invention, the liquid crystal layer 325 may be divided into a plurality of domains so that the liquid crystals may be perpendicularly aligned without the first and second alignment layers 323 and 324 and/or an electric field. The first and second alignment layers 323 and 324 and the liquid crystal layer 325 are encapsulated from the outside by an encapsulation process.

Figure 15:
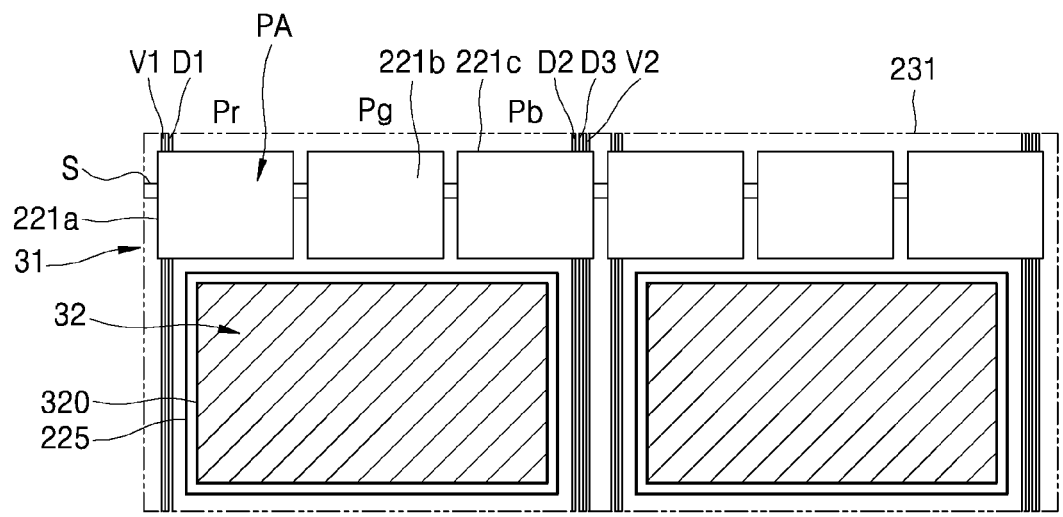
FIG. 15 is a schematic plan view of the organic emission unit of FIG. 4 or 5 according to another embodiment.

FIG. 15 is a schematic plan view of the organic emission unit 21, according to another embodiment. A first electrode 221a of the red pixel Pr, a first electrode 221b of the green pixel Pg, and a first electrode 221c of the blue pixel Pb are formed to correspond to one second region 32. A first data line D1, a second data line D2, and a third data line D3 are respectively connected to the first electrode 221a, the first electrode 221b, and the first electrode 221c. In addition, a first Vdd line V1 is electrically connected to the first electrode 221a and the first electrode 221b, and a second Vdd line V2 is electrically connected to the first electrode 221c.

In the structure described above, a single large second region 32 is formed for three pixels, for example, the red (R), green (G), and blue (B) pixels. Thus, the light transmittance can be further increased, and image distortion that is caused by light scattering can be further reduced.

The transmission window 225 is formed in insulating layers that are formed at a location that corresponds to the second region 32. The liquid crystal device 320 is formed in the transmission window 225. Thus, light transmittance of the first polarizer and the second polarizer can be adjusted. For example, in some embodiments, when the OLED emits light, external light is not transmitted through the second region 32, and thus, a color or an image can be displayed more clearly.

According to the embodiments, it is possible to adjust external light transmittance, and remove external light reflection due to metal and the like included in the transparent display device. For example, according to some embodiments, because the transparent display device includes the liquid crystal device 320 and various optical elements are uniquely formed in the second region 32, transmittance of the display device can be adjusted with low power consumption. Also, external light that is reflected by the metal can be removed. Thus, a visibility of the display device can be improved.

In addition, according to an embodiment, the liquid crystal device 320 is formed in the second region 32 so that external light transmittance can be adjusted by using few elements. Therefore, in comparison to a typical display device (not necessarily prior art) in which the liquid crystal device 320, which includes one or more substrates, is attached at a surface of the transparent display device, less glass substrates can be used in the embodiments of the described technology. Accordingly, the weight and material cost of the display device can be reduced, and the display device can be relatively slimmer.

Figure 16:
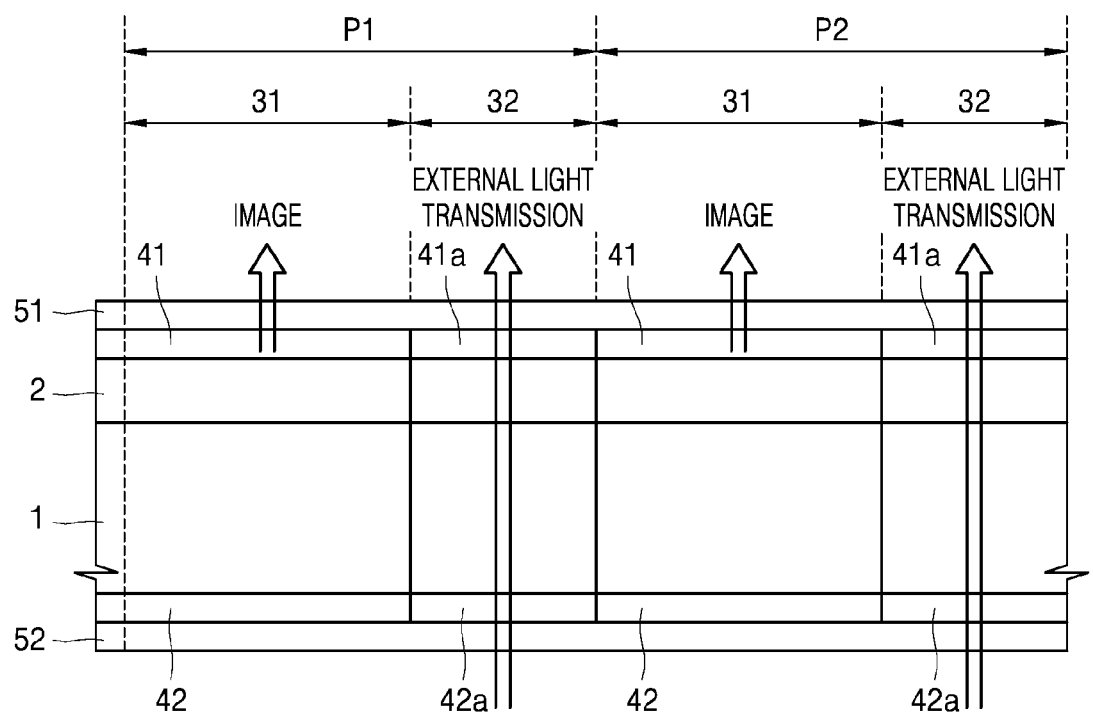
FIG. 16 is a schematic cross-sectional view of the display device according to another embodiment.

FIG. 16 is a schematic cross-sectional view of the display device according to another embodiment. In FIG. 16, a first transmission window 41a is formed to replace a portion of the first retarder 41 that corresponds to the second region 32. A second transmission window 42a is formed to replace a portion of the second retarder 42 that corresponds to the second region 32. The combination of the liquid crystal device 320 and the first and second linear polarizers 51 and 52 can adjust the external light transmittance. Therefore, the portions of the first and second retarders 41 and 42 that correspond to the second region 32 can be removed. However, because external light can be reflected at a portion that corresponds to the first region 31 only when a retarder and a linear polarizer are both formed, portions of the first and second retarders 41 and 42 that correspond to the first region 31 are not removed.

Figure 17:
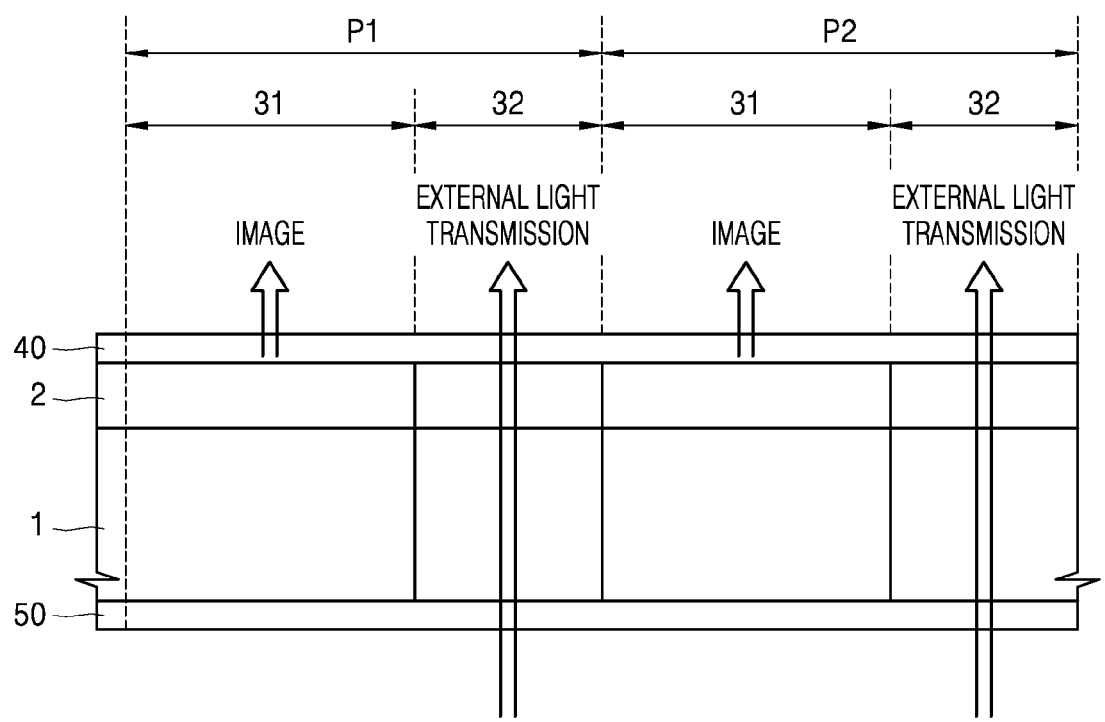
FIG. 17 is a schematic cross-sectional view of a display device according to an embodiment.

FIG. 17 is a schematic cross-sectional view of a display device according to an embodiment. In FIG. 17, a first circular polarizer 40 can replace a combination of the first retarder 41 and the first linear polarizer 51, and a second circular polarizer 50 can replace a combination of the second retarder 42 and the second linear polarizer 52. In addition, the first and second circular polarizers 40 and 50 can be a film type and respectively attached to the substrate 1 and the encapsulating substrate 23.

As described above, according to at least one of the above embodiments, the display device can adjust the external light transmittance thereof.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details can be made therein without departing from the spirit and scope of the present invention as defined by the following claims.

What is claimed is:

1. A display device for controlling light transmittance, the display device comprising:
    a transparent display, including:
        a plurality of pixels each comprising a first region that includes an organic light-emitting diode (OLED); and
        a second region configured to transmit external light, wherein the OLED includes i) a first electrode disposed in the first region of each pixel, ii) an organic layer comprising an organic emission layer, wherein the organic layer is disposed over the first electrode, and iii) a second electrode substantially covering the organic layer and is electrically connected to the pixels;
    a first polarizer disposed over one side of an optical path of light emitted from the transparent display; and
    a second polarizer, disposed over the opposite side of the optical path of the emitted light, wherein the second polarizer is configured to polarize the output of the first polarizer,
    wherein the second region includes a liquid crystal device disposed between the first and second polarizers, wherein the first and second regions do not overlap in the direction of light emission.

2. The display device of claim 1, wherein the liquid crystal device comprises:
    a third electrode formed in the second region of each pixel;
    a liquid crystal layer formed over the third electrode, wherein the liquid crystal layer is not exposed to the environment; and
    a fourth electrode substantially covering the liquid crystal layer and electrically connected to the pixels.

3. The display device of claim 2, further comprising:
    a plurality of thin film transistors (TFTs) formed in the first region of each pixel;
    at least one insulating layer substantially covering the TFTs; and
    a transmission window formed in a portion of the at least one insulating layer corresponding to the second region, wherein the liquid crystal layer is formed in the transmission window.

4. The display device of claim 2, wherein the first electrode is a light-reflecting electrode, and wherein the third electrode is a light-transmitting electrode.

5. The display device of claim 1, wherein the first region comprises a circuit area including a thin film transistor (TFT), and an emission area including the first electrode, and wherein the circuit area and the emission area substantially overlap each other.

6. The display device of claim 4, wherein the fourth and second electrodes are integrally formed.

7. The display device of claim 2, wherein the first and third electrodes are light-transmitting electrodes.

8. The display device of claim 1, wherein the first region comprises a circuit area including a thin film transistor (TFT), and an emission area including the first electrode, and wherein the circuit area and the emission area are adjacent to each other.

9. The display device of claim 7, wherein the fourth and second electrodes are formed separately.

10. The display device of claim 2, wherein the liquid crystal device is formed separately for each pixel.

11. The display device of claim 2, wherein the liquid crystal device is electrically connected to at least two adjacent pixels.

12. The display device of claim 1, wherein vertical alignment nematic (VAN) liquid crystals are formed in the liquid crystal layer.

13. The display device of claim 1, wherein the transparent display device comprises:
    a substrate on which the pixels are formed over a first surface thereof; and
    an encapsulating substrate facing the first surface.

14. The display device of claim 13, wherein the encapsulating substrate is a thin film encapsulation (TFE) member.

15. The display device of claim 13, wherein the first polarizer comprises:
a first linear polarizer formed over the encapsulating substrate, wherein the first polarizer is configured to linearly polarize the external light and output a first linearly polarized light; and
a first retarder formed between the first linear polarizer and the encapsulating substrate, wherein the first retarder is configured to change a phase of the first linearly polarized light by a first phase and output a first retarded light,
wherein the second polarizer comprises:
a second linear polarizer formed below the substrate, wherein the second linear polarizer is configured to linearly polarize the first retarded light and output a second linearly polarized light; and
a second retarder formed between the second linear polarizer and the substrate wherein the second retarder is configured to change the phase of the second linearly polarized light by a second phase, and
wherein the first and second phases have substantially the same absolute value but different rotation directions.

16. A display device for controlling light transmittance, the display device comprising:
a transparent display, including:
a plurality of pixels each comprising a first region that includes an organic light-emitting diode (OLED); and
a second region configured to transmit external light,
wherein the OLED includes i) a first electrode disposed in the first region of each pixel, ii) an organic layer comprising an organic emission layer, wherein the organic layer is disposed over the first electrode, and iii) a second electrode substantially covering the organic layer and is electrically connected to the pixels;
a pixel-defining layer covering edges of the first electrode and including a hole in the second region;
a first polarizer disposed on a surface of the transparent display;
a second polarizer disposed on an opposite surface of the transparent display; and
a liquid crystal device disposed in the hole of the pixel-defining layer.

* * * * *